LEAD FRAME MEMBERS FOR SEMICONDUCTOR DEVICES

Original Filed Oct. 22, 1965

(Actual Size)

INVENTOR.
William L. Lehner
BY
Mueller, Aichele & Rauner
ATTYS.

United States Patent Office 3,431,092
Patented Mar. 4, 1969

3,431,092

LEAD FRAME MEMBERS FOR SEMI-CONDUCTOR DEVICES

William L. Lehner, Phoenix, Ariz., assignor to Motorola, Inc., Franklin Park, Ill., a corporation of Illinois Continuation of application Ser. No. 501,550, Oct. 22, 1965. This application Dec. 21, 1967, Ser. No. 692,396
U.S. Cl. 29—193.5 2 Claims
Int. Cl. H01l 1/10

ABSTRACT OF THE DISCLOSURE

A plastic encapsulated semiconductor device is provided, including a stamped metallic member of a particular configuration for use in the assembly and encapsulation of a plurality of semiconductor devices. The metallic member is comprised of a lead mounting portion extending the full length thereof, defining one longitudinal extremity, and a plurality of leads in spaced parallel groups extending at right angles to the lead mounting portion. A tie bar also extends the full length thereof, parallel to the lead mounting portion and integral with each lead to maintain the leads a predetermined distance apart during fabrication of the devices. One lead in each of the spaced groups includes a die mounting area at one end of the body thereof, extending at right angles to the lead body. The remaining leads in each group are shorter than the lead which includes the die mounting area, and each has an end located in a position convenient for wire connections therefrom to a semiconductor die on the die mounting area of the remaining lead.

CROSS-REFERENCE TO RELATED APPLICATION

This application is a continuation of application Ser. No. 501,550, filed Oct. 22, 1965, now abandoned, entitled, Metallic Member for Semiconductor Devices and is related to the Helda-Lincoln application Ser. No. 465,123, filed June 18, 1965, which is owned by applicant's assignee, Motorola, Inc. The present invention is an improvement over the invention of said Helda-Lincoln application.

This invention relates to semiconductor devices, and more particularly to a metallic mounting member upon which an active element may be mounted and connected to form a completed device utilizing automatic equipment for assembly and encapsulation, and an assembled semiconductor device utilizing said member.

The active element or die of a semiconductor device is usually of very minute size. This element is advantageously mounted in such a device so as to form a good ohmic contact between the element and the mounting area. This mounting area also serves to dissipate heat from the semiconductor element and as an electrical connection between the element and the external circuit. A current practice in the semiconductor art is to mount the element on a header from which the external leads extend. This header is connected directly to one of the external leads and thereby dissipates heat and connects the element to the external circuit. After the element has been connected, usually by fine wires to the other external leads, the assembly is enclosed in a suitable protecting medium, usually a metal can, which is hermetically sealed to the header. This method of device assembly involves the handling of many individual parts in the fabrication of the header and subsequent device assembly. A sizeable portion of the price of a device assembled in this manner is represented in labor cost for handling small individual items and in pre-assembling the headers.

Modern semiconductor technology has substantially reduced the cost of fabricating the relatively minute semiconductor devices. However, the cost of packaging the device has not been correspondingly reduced by this advanced technology, and therefore the cost of such a device has not fully reflected the advanced state of the semiconductor art.

An object of this invention is to provide a plastic encapsulated semiconductor device having parts which lend themselves to automated assembly, and yet provide a device which can be mass produced in complete uniformity.

Another object of this invention is to provide a metallic member for mounting a semiconductor die which will reduce the cost of the assembly of a semiconductor device by permitting the use of high speed assembling and encapsulating equipment.

A further object of this invention is to provide a metallic member for mounting a semiconductor element wherein the assembled device will have a conventional emitter-base-collector grouping of leads and the leads will be rounded so as to permit easy insertion in standard receptacles in electrical equipment.

A feature of this invention is a plastic encapsulated stamped lead semiconductor device which is minute in size, sturdy in use, and adaptable to existing sockets and equipment receptacles.

Another feature of this invention is the provision of a metallic member having an array of integrally connected individual leads with wire bonding and die mounting areas thereon. These leads are joined so as to maintain the wire bonding and die mounting areas in precise alignment during the die mounting and wire bonding operations. This also facilitates the handling as a single unit of a plurality of groups of leads during the assembly and encapsulation of the semiconductor device.

A further feature of this invention is the provision of a stamped metallic member having an indexing array in two opposed portions which are integral with portions of integral leads in the member, thereby permitting precise orientation of the wire bonding and mounting areas in automatic assembly and encapsulation equipment.

Another feature of this invention is the provision of a single metallic member having a plurality of groups of leads in which one lead has a die mounting area projecting at 90° therefrom in a plane parallel to the plane of the plurality of groups of leads. The die mounting area is arranged to cooperate with the other leads so that the semiconductor device will have, for example, an emitter-base-collector lead configuration.

In the accompanying drawings.

A metallic member according to this invention is stamped and shaped from a metallic strip to have a continuous lead mounting portion and leads extending away therefrom. These leads are in the same general plane as the lead mounting portion and extend at 90° therefrom. The leads are arranged in spaced parallel groups, each group having a first, second, and third lead. The first and second lead have wire bonding areas at one end. The third lead has a die mounting area extending at 90° therefrom in the same longitudinal plane as the wire bonding areas. The die mounting area is spaced from the wire bonding areas and comprises extension of one of the leads. A tie strip parallel to the lead mounting portion joins the plurality of leads in a group. A top joining band parallel to the lead mounting portion is joined with the third lead. An indexing array is provided in the lead mounting portion and the top joining band to aid in aligning the member in assembling and molding equipment.

More specifically, the metallic member having the die mounting area thereon will preferably be in the same longitudinal plane as the wire bonding areas for adjoined leads in a three lead group. This die mounting area will be slightly lower than the plane of leads, although it may be utilized when it is in the same plane. The use of a slightly lower plane has been found to facilitate the assembling of the device and reduce the incidence of short circuits caused by the fine connecting wires contacting erroneous portions of the die mounted thereon. This structure also is desirable in that it permits the convenient movement of the metallic member normal to the axis of the die mounting and wire bonding equipment. In wire bonding the angle at which the fine wire is oriented relative to the bond has a substantial effect upon the strength of the connection. Generally, the straighter the wire is maintained, the greater is the holding strength of the bond.

A transistor device which utilizes this metallic member as the principal part of the unit must be capable of being substituted in circuits designed for existing transistors with conventional wire leads of round cross section. To accomplish this, the leads of the transistor have an emitter-base-collector configuration which is sufficiently round in shape so that they may be plugged into existing sockets. The metallic member is of a configuration such that it may be formed by high speed metal punching equipment, which permits rapid production of many metallic members with a high degree of reproducibility. Punching also facilitates the coining or rounding of originally flat leads and the formation of the wire bonding and die mounting areas as a step in the punching operation. This strip may also be formed by a combination of etching and stamping with a high degree of reproducibility.

Figure 1:
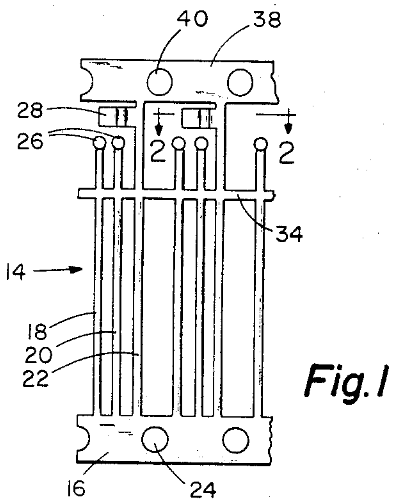
FIG. 1 is an enlarged top view of a metallic member formed according to the present invention.

A metallic member 14, FIG. 1, according to this invention, permits the assembly of a plurality of transistors on a continuous integral strip. Between about 50 and 100 transistors with groups of three leads may conveniently and rapidly be assembled from a single metallic member 14. A lead mounting portion 16 extends the entire length of member 14 and has a plurality of groups extending therefrom comprising an emitter lead 18, a base lead 20, and a collector lead 22. Mounting portion 16 is wider than the leads so that it will have sufficient strength to maintain them in a desired position and aid in the handling of a multiple number of devices during the device assembling. Indexing holes 24 are punched in mounting portion 16 during the forming of the metallic member. Holes 24 serve to orient metallic member 14 during the important steps of punching the member and assembly and encapsulation of the transistor device.

Figure 2:
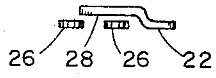
FIG. 2 is a view looking into section 2—2 of FIG. 1 demonstrating the separation of planes of the die mounting area and wire bonding areas.

Leads 18, 20 and 22 are arranged in spaced parallel groups of three along mounting portion 16. Emitter lead 18 and base lead 20 terminate on one end in wire bonding areas 26 which are formed during the stamping operation. Collector lead 22 has a die mounting area 28 extending at 90° therefrom. Die mounting area 28 is adjacent to and spaced from wire bonding areas 26 in a plane slightly lower than the wire bonding areas, and is in the same longitudinal plane as emitter lead 18 and base lead 20. This places die mounting area 28 in a straight line with the emitter lead 18 and base lead 20 and the wire bonding areas 26 thereon. Die mounting area 28 is a different plane from that of leads 18, 20, 22 and mounting portion 16 to facilitate the fabrication of the transistor device as will be explained later. The appearance of this displacement is more clearly shown in FIG. 2 which is a view, looking at section 2—2 of a group of three leads in FIG. 1. In this view it can clearly be seen that wire bonding areas 26 are in the same plane as collector lead 22. The amount of displacement of die mounting area 28 may vary depending upon the device being assembled.

A top joining band 38, FIG. 1, and a tie strip 34, parallel to each other and to lead mounting portion 16, extend the length of member 14. Top joining band 38 is integral with collector lead 22 and helps to maintain this lead and die mounting portion 28 in the correct orientation. Top joining band 38 has indexing holes 40 to further facilitate the orientation of member 14 in the assembly equipment. Tie strip 34 is intermediate top joining band 38 and mounting portion 16, is integral with all of the leads, and helps to maintain die bonding area 28 in proper orientation relative wire bonding areas 26. After member 14 has been punched and prior to any device assembly it may be gold plated to facilitate wire bonding and die mounting.

Figures 3, 4:
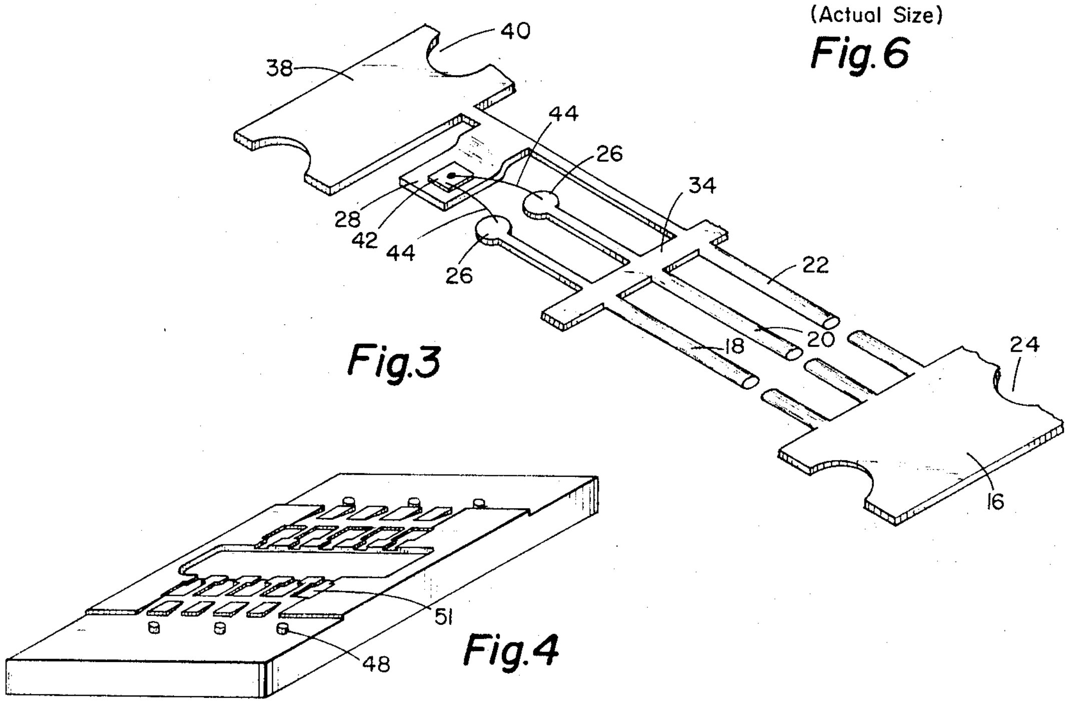
FIG. 3 is an enlarged perspective view of the metallic member shown in FIG. 1.
FIG. 4 is a perspective view of a portion of a transfer mold used to form the encapsulation about the die mounted on a metallic member connected to leads for the member, and fabricated according to the present invention.

The use of member 14 reduces the number of steps required to assemble a transistor and results in a higher production rate. In the assembling of a transistor device using member 14, a transistor element or die 42 (FIG. 3) is mounted on die mounting area 28. Die mounting area 28 is automatically positioned under the die bonder by an indexing portion of the die bonder machine which cooperates with indexing holes 24 and 40. In mounting the die, the operator of the die bonder only observes the selection of the die. After the die has been selected, it is automatically mounted on the die mounting area, for the assembly machine can be built to rapidly complete this step because of the precise location of the die mounting area.

Die 42 is then connected to wire bonding areas 28 with fine wires 44. Again, indexing holes 24 and 40 are used to precisely position these areas. In this step, the operator bonds one of the wires 44 to the desired region of die 42 and then the wire is automatically bonded to the corresponding lead. This process is then repeated for the other region of die 42 and the other lead. In this manner, the die is joined to the three external leads of a transistor device. Because die mounting area 28 is directly in line with wire bonding areas 26, the almost straight line wire bonds that result facilitate the automatic wire bonding. In addition, die mounting area 28 is lowered slightly so there is a reduced probability of a short circuit occurring between wires 44 and portions of die 42 and metallic member 14.

After die 42 is mounted and the wire connections made, top joining band 38 is sheared from the entire metallic member 14. Metallic member 14, supporting between about 50 to 100 units comprising die 42 and its connecting wires, is positioned in a multiple cavity mold (FIG. 4) utilizing holes 24 in cooperation with pins 48 on the mold to properly align the individual assembled semiconductor units in separated cavities 51. In this manner, the units may be rapidly encapsulated in an epoxy or other high grade plastic.

Figure 6:
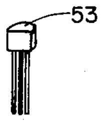
FIG. 6 is an actual size perspective view of an encapsulated transistor ready for insertion in a circuit.

The previous shearing of top joining band 38 results in a plurality of joined transistors 53 (FIG. 5) with desired leads, 18, 20, 22 being the only conductors projecting therefrom. Transistors 53 are then separated by shearing tie strip 34 and mounting portion 16. FIG. 6 represents the actual size of a transistor 53 manufactured utilizing the metallic member of this invention.

Figure 5:
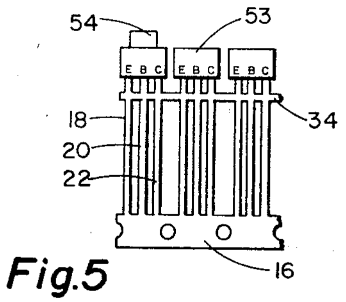
FIG. 5 is a top view of a plurality of transistors after encapsulation in a plastic material.

Referring to FIG. 5, another embodiment is shown suitable for a device where additional heat dissipation capabilities are required. Die mounting area 28 (FIG. 3) is extended upwardly toward top joining band 38 so that a portion thereof forms a heat sink 54 (FIG. 5) extending from the plastic encapsulated transistor 53. Because the die is mounted directly on a portion of heat sink 54, excellent heat dissipation is obtained.

A metallic member fabricated as herein disclosed facilitates the use of automatic equipment in the assembling and encapsulation of a transistor, and increases the yield of acceptable units, by simplifying and reducing the processing steps required to obtain each transistor device. The transistor device produced utilizing this metallic member also has the desirable emitter-base-collector lead configuration for subsequent assembly in an electrical application.

I claim:

1. A metallic member for use in the fabrication of a plurality of molded plastic encapsulated semiconductor devices primarily by automated equipment and by molding equipment using pressure and serving as the frame during the fabrication of such devices, comprising predetermined portions thereof wherein each portion includes the utilmate contact lead and the semiconductor unit mounting requirements for each of the plurality of encapsulated semiconductor devices to be fabricated, each said predetermined portion comprising a plurality of metal means with a selected one of said plurality of metal means having an end portion which is larger than the corresponding end portion of each other of the metal means in said predetermined portion, with said larger end portion adapted to receive a semiconductor unit thereon, said larger end portion being positioned substantially at a right angle to the remainder of said selected one of said metal means and having a semiconductor-unit-mounting area thereon, and with said mounting area connected by a stepped portion with the remainder of said selected one of said metal means to provide said mounting area in a plane which is displaced from the plane of said remainder of said selected one of said metal means adapted to receive a semiconductor unit on said mounting area for connection with the end portion of each other of the metal means in a predetermined portion, each other of said metal means in said predetermined portion having the end portion thereof adjacent said larger end portion and adapted to have conductor means connecting the same with a semiconductor unit, two parallel spaced-apart strip portions with each strip portion being integral with metal means in said predetermined portions of said metallic member, with one strip portion serving to support the metal means at one end of each, and with the other of said strip portions being positioned between said one strip portion and the other end portion of such metal means, and with both said strip portions adapted to be severed from the metal means in a fabricating step after each semiconductor device has been plastic encapsulated on the metallic member.

2. In a metallic member in accordance with claim 1 wherein said member has a third strip portion parallel with said two parallel spaced-apart strip portions and integral with all of said selected metal means in said member at the larger end portion thereof, and with said third strip being severable from said metal means during the fabrication of the molded plastic encapsulated semiconductor devices.

References Cited

UNITED STATES PATENTS 3,171,187 3/1965 Ikeda et al.
3,317,287 5/1967 Caracciolo.

DARRELL L. CLAY, *Primary Examiner.*

U.S. Cl. X.R.

29—588, 589, 630; 113—119; 264—272